(12) United States Patent
Jang et al.

(10) Patent No.: US 8,399,308 B2
(45) Date of Patent: *Mar. 19, 2013

(54) METHOD FOR FORMING SEMICONDUCTOR DEVICE HAVING METALLIZATION COMPRISING SELECT LINES, BIT LINES AND WORD LINES

(75) Inventors: Young-Chul Jang, Yongin-si (KR); Won-Seok Cho, Suwon-si (KR); Jae-Hoon Jang, Seongnam-si (KR); Soon-Moon Jung, Yongin-si (KR); Yang-Soo Son, Yongin-si (KR); Min-Sung Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/236,000

(22) Filed: Sep. 19, 2011

(65) Prior Publication Data

US 2012/0009767 A1      Jan. 12, 2012

Related U.S. Application Data

(60) Continuation of application No. 12/588,240, filed on Oct. 8, 2009, now Pat. No. 8,034,668, which is a division of application No. 11/655,115, filed on Jan. 19, 2007, now Pat. No. 7,601,998.

(30) Foreign Application Priority Data

Sep. 14, 2006   (KR) .................. 10-2006-0089316

(51) Int. Cl.
*H01L 21/82*    (2006.01)

(52) U.S. Cl. ........ 438/129; 438/479; 438/478; 438/675; 438/618; 438/275; 257/288; 257/E21.09; 257/67; 257/392; 257/E21.575

(58) Field of Classification Search .................. 438/129, 438/479, 478, 675, 618, 275; 257/288, E21.09, 257/67, 392, E21.575

See application file for complete search history.

(56) References Cited

U.S. PATENT DOCUMENTS

| 6,501,127 B2 | 12/2002 | Mori |
| 2005/0179061 A1 | 8/2005 | Jang et al. |
| 2006/0028861 A1 | 2/2006 | Han et al. |

FOREIGN PATENT DOCUMENTS

| JP | 2000-049351 A | 2/2000 |
| KR | 10-2005-0073956 A | 7/2005 |
| KR | 10-2006-0012847 A | 2/2006 |

*Primary Examiner* — Kimberly Rizkallah
*Assistant Examiner* — Timor Karimy
(74) *Attorney, Agent, or Firm* — Lee & Morse, P.C.

(57) ABSTRACT

A semiconductor device includes a semiconductor substrate including a first region having a cell region and a second region having a peripheral circuit region, first transistors on the semiconductor substrate, a first protective layer covering the first transistors, a first insulation layer on the first protective layer, a semiconductor pattern on the first insulation layer in the first region, second transistors on the semiconductor pattern, a second protective layer covering the second transistors, the second protective layer having a thickness greater than that of the first protective layer, and a second insulation layer on the second protective layer and the first insulation layer of the second region.

14 Claims, 11 Drawing Sheets

METHOD FOR FORMING SEMICONDUCTOR DEVICE HAVING METALLIZATION COMPRISING SELECT LINES, BIT LINES AND WORD LINES

CROSS REFERENCE TO RELATED APPLICATION

This is a continuation of application Ser. No. 12/588,240, filed Oct. 8, 2009 now U.S. Pat. No. 8,034,668, which in turn is a divisional application based on application Ser. No. 11/655,115, filed Jan. 19, 2007, now U.S. Pat. No. 7,601,998 B2, the entire contents of which is hereby incorporated by reference.

BACKGROUND OF THE INVENTION

1. Field of the Invention

The present invention relates to a semiconductor device and a method for forming the same. More particularly, the present invention relates to a semiconductor device having contact holes of differing depths and a method for forming the contact holes simultaneously.

2. Description of the Related Art

Electronic products such as computers, mobile phones, multimedia players, digital cameras, etc., may include semiconductor devices such as a memory chip for storing information and a processing chip for controlling information. The semiconductor devices may include electronic elements such as a transistor, a resistor, a capacitor, etc. Electronic elements may be integrated on a semiconductor substrate, and there may be a demand for a high level of integration in order to provide the high performance and reasonable price that consumers have come to demand.

In order to achieve high levels of integration, advanced processing technologies such as a photolithography process may be required in the manufacturing process for the semiconductor device. However, advanced processing technologies may be immensely expensive and time consuming to develop, thus limiting advances in the degree of integration.

Recently, advances have been made in increasing the level of integration by forming semiconductor devices having a plurality of stacked layers, which may necessitate the formation of contact plugs of differing heights in a single device. For example, flash memory devices having multi-layer transistors have been developed in order to provide a high degree of integration. A typical method for forming such a flash memory device may include a process of forming contact plugs having respectively different heights. In particular, to form the contact plugs having respectively different heights, contact holes having respectively different depths may be formed.

If contact holes having different depths are simultaneously formed through one etching process, etching damage may occur in a thin layer at the bottom of one of the contact holes, i.e., at the bottom of the less-deep contact hole. Such etching damage may reduce the reliability and the operational characteristics of the device. On the other hand, if the contact holes are formed separately, the number of processes increases, which may lower productivity and/or product yield.

SUMMARY OF THE INVENTION

The present invention is therefore directed to a semiconductor device and a method for forming the same, which substantially overcome one or more of the problems due to the limitations and disadvantages of the related art.

It is therefore a feature of an embodiment of the present invention to provide a semiconductor device and a method of forming the same in which contact plugs having different heights may be simultaneously formed.

It is therefore another feature of an embodiment of the present invention to provide a semiconductor device and a method of forming the same in which damage to a thin layer at a bottom of a contact hole may be reduced or eliminated.

It is therefore another feature of an embodiment of the present invention to provide a highly-integrated semiconductor device having multi-layer transistors, which may be efficiently manufactured and which may exhibit enhanced reliability and the operational characteristics.

It is therefore another feature of an embodiment of the present invention to provide a method of forming a semiconductor device in which contact plugs of different heights may be formed simultaneously, which may enhance productivity and/or product yield.

It is therefore another feature of an embodiment of the present invention to provide a semiconductor device having at least one protective layer configured to prevent over-etching of a relatively shallow contact hole.

It is therefore another feature of an embodiment of the present invention to provide a semiconductor device having two protective layers formed of a same material, one thicker than the other, wherein the thicker protective layer corresponds to a relatively shallow contact hole and the thinner protective layer corresponds to a deeper contact hole.

It is therefore another feature of an embodiment of the present invention to provide a method of forming a semiconductor device that includes providing a relatively thick etch stop layer for a first contact hole, providing a thinner etch stop layer for a second contact hole, and etching the first and second contact holes simultaneously.

At least one of the above and other features and advantages of the present invention may be realized by providing a semiconductor device, including a semiconductor substrate including a first region having a cell region and a second region having a peripheral circuit region, first transistors on the semiconductor substrate, a first protective layer covering the first transistors, a first insulation layer on the first protective layer, a semiconductor pattern on the first insulation layer in the first region, second transistors on the semiconductor pattern, a second protective layer covering the second transistors, the second protective layer having a thickness greater than that of the first protective layer, and a second insulation layer on the second protective layer and the first insulation layer of the second region.

The first transistors may include cell transistors in the first region and peripheral circuit transistors in the second region, and the device may further include at least one first contact plug that penetrates the second insulation layer and the second protective layer to contact a second transistor, and at least one second contact plug that penetrates the second insulation layer, the second protective layer, the first insulation layer, and the first protective layer to contact a peripheral circuit transistor.

The first and second protective layers may have an etch selectivity with respect to the first and second insulation layers.

At least one of the above and other features and advantages of the present invention may be realized by providing a semiconductor device, including a semiconductor substrate including a first region having a cell region and a second region having a peripheral circuit region, a first string select line, a first ground select line, and first word lines on the semiconductor substrate in the first region, the first word lines being disposed between the first string select line and the first ground select line, peripheral circuit transistors on the semiconductor substrate in the second region, a first protective layer covering the first string select line, the first ground select line, the first word lines, and the peripheral transistors, a first insulation layer on the first protective layer, a semiconductor pattern on the first insulation layer in the first region, second word lines on the semiconductor pattern, a second protective layer covering the second word lines, the second protective layer having a thickness greater than that of the first protective layer, a second insulation layer disposed on the second protective layer and the first insulation layer in the second region, a first contact plug that penetrates the second insulation layer and the second protective layer to contact a second word line, and a second contact plug that penetrates the second insulation layer, the second protective layer, the first insulation layer, and the first protective layer to contact a peripheral circuit transistor.

The device may further include a third contact plug that penetrates the second insulation layer, the second protective layer, the semiconductor pattern, the first insulation layer, and the first protective layer to contact the semiconductor substrate at one side of the first string select line, and a fourth contact plug that penetrates the second insulation layer, the second protective layer, the semiconductor pattern, the first insulation layer, and the first protective layer to contact a first word line.

The third contact plug and the fourth contact plug may be a same material. The first contact plug and the second contact plug may be a same material. The first and second protective layers may have an etch selectivity with respect to the first and second insulation layers.

The device may further include a second string select line and a second ground select line on the semiconductor pattern that correspond to the first string select line and the first ground select line, respectively. The device may further include a common source line that penetrates the second insulation layer, the second protective layer, the semiconductor pattern, the first insulation layer, and the first protective layer, wherein the common source line electrically connects the first and second ground select lines.

At least one of the above and other features and advantages of the present invention may also be realized by providing a method of forming a semiconductor device, including providing a semiconductor substrate including a first region having a cell region, and a second region having a peripheral circuit region, forming first transistors on the semiconductor substrate, forming a first protective layer that covers the first transistors, forming a first insulation layer on the first protective layer, forming a semiconductor layer on the first insulation layer, forming second transistors on the semiconductor layer in the first region, forming a second protective layer covering the second transistors, the second protective layer having a thickness greater than that of the first protective layer, removing the second protective layer and the semiconductor layer in the second region, and forming a second insulation layer on the second protective layer in the first region and on the first insulation layer in the second region.

The first transistors may include cell transistors in the first region and peripheral circuit transistors in the second region, and the method may further include forming a first contact plug that penetrates the second insulation layer and the second protective layer to contact a second transistor; and forming a second contact plug that penetrates the second insulation layer, the second protective layer, the first insulation layer and the first protective layer to contact a peripheral circuit transistor.

The first and second protective layers may have an etch selectivity with respect to the first and the second insulation layers.

At least one of the above and other features and advantages of the present invention may be realized by providing a method of forming a semiconductor device, including providing a semiconductor substrate including a first region having a cell region and a second region having a peripheral circuit region, forming first word lines on the semiconductor substrate in the first region, the first word lines being disposed between a first string select line and a first ground select line, forming a peripheral circuit transistor in the second region, forming a first protective layer that covers the first string select line, the first ground select line, the first word lines, and the peripheral circuit transistor, forming a first insulation layer on the first protective layer, forming a semiconductor layer on the first insulation layer, forming second word lines on the semiconductor layer in the first region, forming a second protective layer that covers the second word lines, the second protective layer having a thickness greater than that of the first protective layer, removing the second protective layer and the semiconductor layer in the second region, forming a second insulation layer on the second protective layer in the first region and on the first insulation layer in the second region, forming a first contact hole that exposes the second word line, and forming a second contact hole that exposes the peripheral circuit transistor, wherein the first contact hole and the second contact hole are formed at a same time.

The method may further include forming a first contact plug in the first contact hole, the first contact plug penetrating the second insulation layer, and the second protective layer to contact the second word line, and forming a second contact plug in the second contact hole, the second contact plug penetrating the second insulation layer, the second protective layer, the first insulation layer, and the first protective layer to contact the peripheral circuit transistor.

The first protective layer and the second protective layer may be formed of a same material. The method may further include forming a third contact plug that penetrates the second insulation layer, the second protective layer, the semiconductor pattern, the first insulation layer, and the first protective layer, the third contact plug contacting the semiconductor substrate at one side of the first string select line, and forming a fourth contact plug that penetrates the second insulation layer, the second protective layer, the semiconductor pattern, the first insulation layer, and the first protective layer, the fourth contact plug contacting a first word line.

Forming the third contact plug may include etching the second insulation layer, the second protective layer, the semiconductor pattern, the first insulation layer, and the first protective layer to form a third contact hole that exposes the semiconductor substrate at one side of the first string select line, forming the fourth contact plug may include etching the second insulation layer, the second protective layer, the semiconductor pattern, the first insulation layer, and the first protective layer to form a fourth contact hole that exposes the first word line, and the third contact hole and the fourth contact hole may be formed by a same etching process. The third contact plug and the fourth contact plug may be formed of a same material.

The first and second protective layers may have an etch selectivity with respect to the first and second insulation layers.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIGS. 3A through 9A correspond to FIG. 2A and illustrate stages in a method of forming a semiconductor device according to a second embodiment of the present invention;

FIGS. 3B through 9B correspond to FIG. 2B and illustrate stages in a method of forming a semiconductor device according to the second embodiment of the present invention;

FIGS. 10A through 11A correspond to FIG. 2A and illustrate stages in a method of forming a semiconductor device according to a third embodiment of the present invention; and FIGS. 10B through 11B correspond to FIG. 2B and illustrate stages in a method of forming a semiconductor device according to the third embodiment of the present invention.

DETAILED DESCRIPTION OF THE INVENTION

Korean Patent Application No. 2006-89316, filed on Sep. 14, 2006, in the Korean Intellectual Property Office, and entitled: "Semiconductor Memory Device and Method for Forming the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. It will be understood that "contacting" a transistor refers to contacting a source/drain region or a gate electrode of the transistor. Like reference numerals refer to like elements throughout.

In the following description, reference may be made to particular embodiments in order to provide a clear understanding of the present invention. However, these references are to be considered illustrative and not restrictive. For example, particular reference may be made to a stacked memory device, but it will be understood that embodiments of the present invention may be similarly applied to other devices. Moreover, the particular references to a stacked memory device are not limited to a particular memory technology. Thus, these embodiments may be applied to volatile memory devices such as SRAM as well as non-volatile memory devices.

Figure 1:
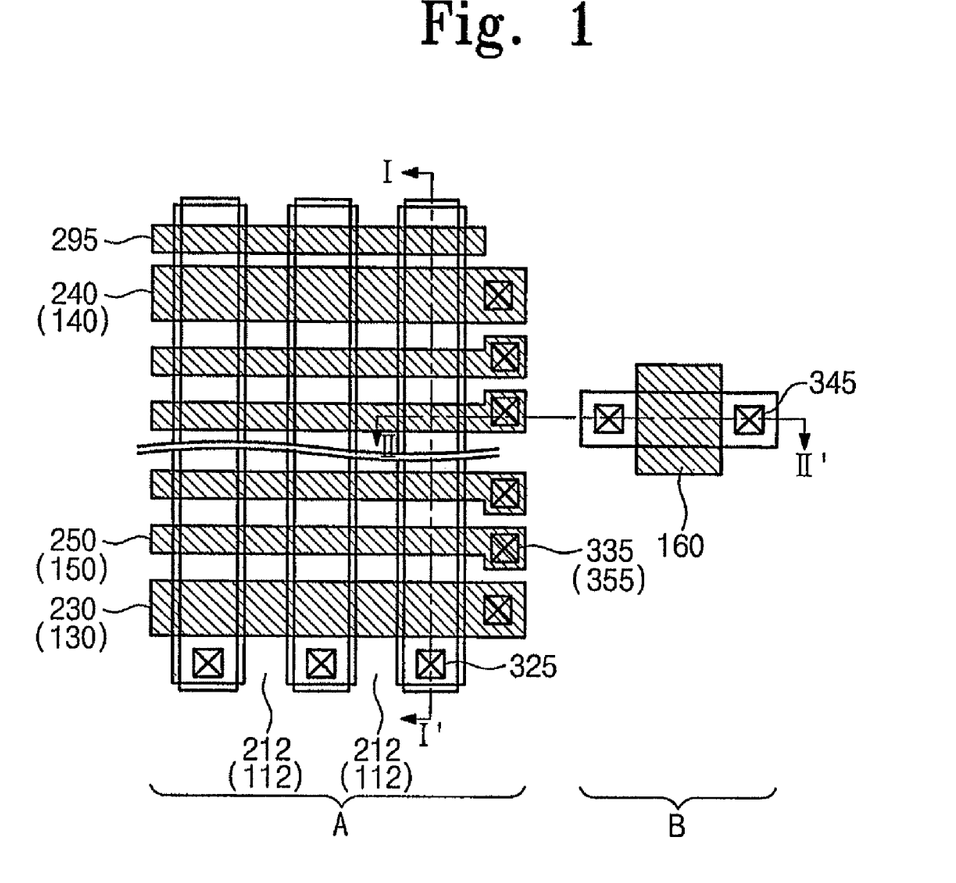
FIG. 1 illustrates a plan view of a semiconductor device according to a first embodiment of the present invention.
Figure 2A:
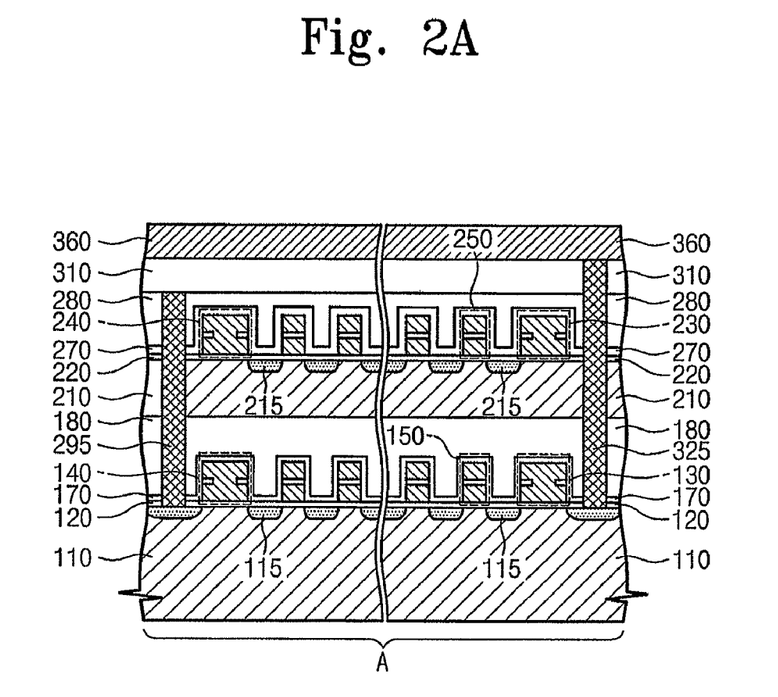
FIG. 2A illustrates a cross-sectional view taken along line I-I' of FIG. 1.
Figure 2B:
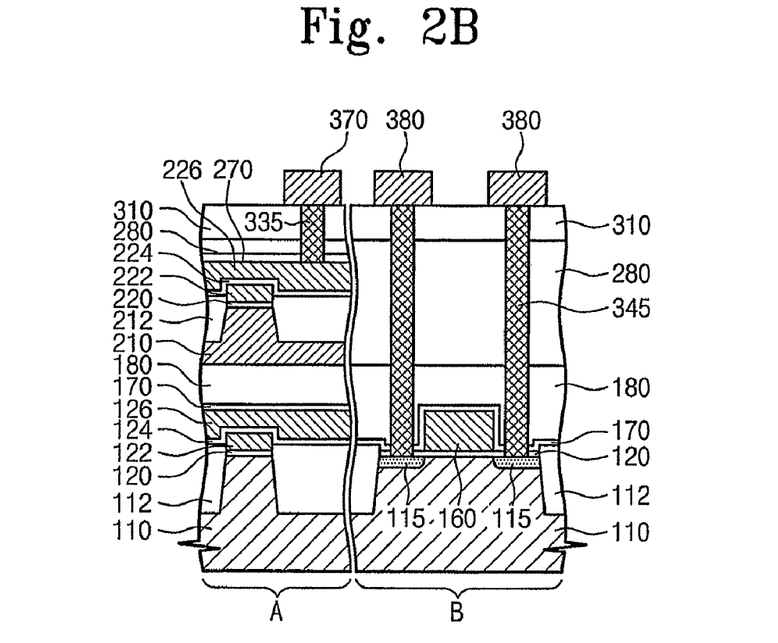
FIG. 2B illustrates a cross-sectional view taken along line II-II' of FIG. 1.

FIG. 1 illustrates a plan view of a semiconductor device according to a first embodiment of the present invention, FIG. 2A illustrates a cross-sectional view taken along line I-I' of FIG. 1, and FIG. 2B illustrates a cross-sectional view taken along line II-II' of FIG. 1. Referring to FIGS. 1, 2A, and 2B, a device, e.g., a memory device, may be formed on a semiconductor substrate 110 that includes a first region A having a cell region and a second region B having a peripheral circuit region. An active region may be defined by a device isolation layer 112 in the semiconductor substrate 110, and a gate insulation layer 120 may be on the active region.

A first string select line 130 and a first ground select line 140 may be disposed in an active region in the first region A. First word lines 150 may be between the first string select line 130 and the first ground select line 140. In the plan view, the first word lines 150, the first string select line 130 and the first ground select line 140 may be generally linear and may be generally parallel to one another.

The first string select line 130, the first ground select line 140, and the first word lines 150 may include a floating gate pattern 122 and a control gate pattern 126. In the first string select line 130 and the first ground select line 140, the floating gate pattern 122 may be electrically connected to the control gate pattern 126. In the first word lines 150, the floating gate pattern 122 may be insulated from the control gate pattern 126 by an inter-gate insulation layer 124. Impurity regions 115 may be disposed at opposite sides of the first string select line 130, the first ground select line 140, and the first word lines 150. The first string select line 130 and the first ground select line 140, with the impurity regions 115 at the sides thereof, may respectively form a string select transistor and a ground select transistor. The first word lines 150, with the impurity regions at the sides thereof, may form cell transistors.

A peripheral circuit gate electrode 160 may be disposed in an active region in the second region B, and impurity regions 115 may be disposed in the semiconductor substrate at both opposite of the peripheral circuit gate electrode 160. The peripheral circuit gate electrode 160, with the impurity regions 115, may form a peripheral circuit transistor. The peripheral circuit transistor may be, e.g., a high-voltage transistor, a low voltage transistor, etc.

A first protective layer 170 may cover the first string select line 130, the first ground select line 140, the first word lines 150, and the peripheral circuit gate electrode 160. The first protective layer 170 may have a uniform thickness. In an implementation (not shown), sidewall spacers may be disposed between the first protective layer 170 and respective sidewalls of the first string select line 130, the first ground select line 140, the first word lines 150, and the peripheral circuit gate electrode 160, and the first protective layer 170. A first insulation layer 180 may be on the first protective layer 170.

Referring to FIG. 2B, a semiconductor pattern 210 may be on the first insulation layer 180 in the first region A. An active region may be defined by a device isolation layer 212 in the semiconductor pattern 210. A gate insulation layer 220 may be on the active region.

A second string select line 230 and a second ground select line 240 may be on the active region of the semiconductor pattern 210, and second word lines 250 may be between the second string select line 230 and the second ground select line 240. The second string select line 230, the second ground select line 240, and the second word lines 250 may include a floating gate pattern 222 and a control gate pattern 226. In the second string select line 230 and the second ground select line 240, the floating gate pattern 222 may be electrically connected to the control gate pattern 226. In the second word lines 250, the floating gate pattern 222 may be insulated from the control gate pattern 226 by an inter-gate insulation layer 224 interposed between the floating gate pattern 222 and the control gate pattern 226. Impurity regions 215 may be disposed in the semiconductor pattern 210 at opposite sides of the second word line 250.

In an implementation (not shown), an impurity region electrically connected to each of a common source line 295 and a bit line contact 325 may be disposed along sides of the second string select line 230 and the second ground select line 240.

The second string select line 230, the second ground select line 240, and the second word lines 250, with the impurity regions 215 disposed at the sides thereof, may form the string select transistor, the ground select transistor, and the cell transistors, respectively.

A second protective layer 270 may cover the second string select line 230, the second ground select line 240, and the second word lines 250. The second protective layer 270 may be thicker than the first protective layer 170. In an implementation (not shown), sidewall spacers may be disposed between the second protective layer 270 and respective sidewalls of the first string select line 230, the first ground select line 240, and the first word lines 250. The second protective layer 270 may have a uniform thickness. A second insulation layer 280 may be on the first protective layer 170 in the first region A and on the first insulation layer 180 in the second region B. A third insulation layer 310 may be on the second insulation layer 280.

The first and second protective layers 170 and 270 may have an etch selectivity with respect to the first and second insulation layers 180 and 280. For example, the first and second protective layers 170 and 270 may include a silicon nitride layer, and the first and second insulation layers 180 and 280 may include a silicon oxide layer.

Referring to FIGS. 1 and 2A, the common source line 295 may be disposed to one side of the first and second ground select lines 130 and 140. The common source line 295 may penetrate the second insulation layer 280, the second protective layer 270, the semiconductor pattern 210, the first insulation layer 180, and the first protective layer 170 to electrically connect to the ground select transistors. The common source line 295 may extend in the generally same direction of the first and second ground select lines 130 and 140.

The bit line contact plug 325 and a word line contact plug 335 may be disposed in the first region A, and a peripheral circuit contact plug 345 may be disposed in the second region B. The bit line contact plug 325 may penetrate the third insulation layer 310, the second insulation layer 280, the second protective layer 270, the semiconductor pattern 210, the first insulation layer 180, and the first protective layer 170 to electrically connect the string select transistor to the bit line 360. The word line contact plug 335 may penetrate the third insulation layer 310, the second insulation layer 280, and the second protective layer 270 to electrically connect the second word line 250 to the first metal pattern 370. The peripheral circuit contact plug 345 may penetrate the third insulation layer 310, the second insulation layer 280, the first insulation layer 180, and the first protective layer 170 to electrically connect the peripheral circuit transistor to the second metal pattern 380. The word line contact plug 335 and the peripheral contact plug 345 may include the same material.

The first and second metal patterns 370 and 380 may be lines. In another implementation, the first and second metal patterns 370 and 380 may be contact pads that electrically connect the contact plugs 335 and 345 to lines (not shown) on the first and second metal patterns 370 and 380.

Figure 3A:
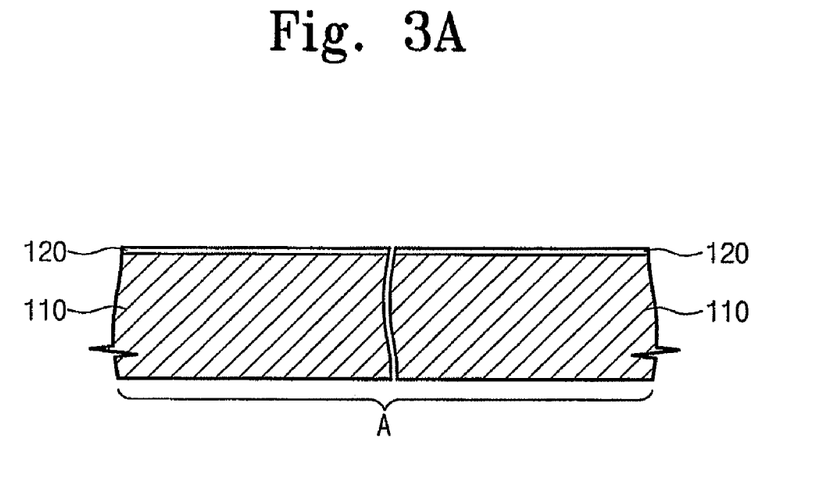
Figure 3B:
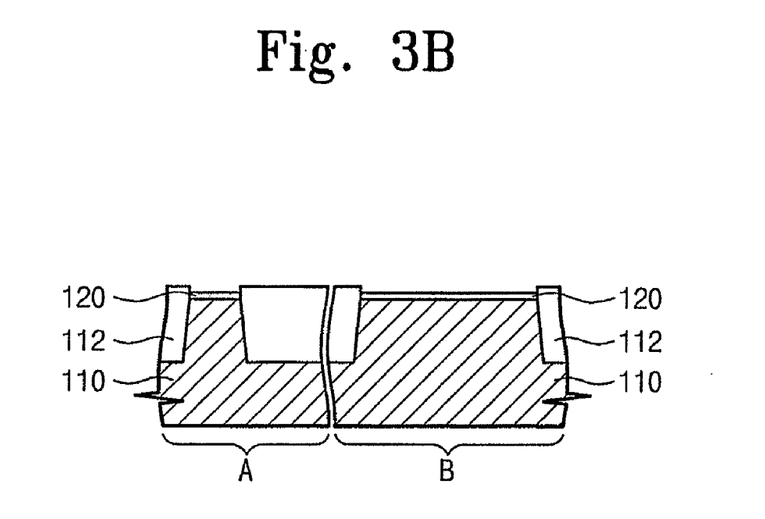

FIGS. 3A through 9A correspond to FIG. 2A and illustrate stages in a method of forming a semiconductor device according to a second embodiment of the present invention, and FIGS. 3B through 9B correspond to FIG. 2B and illustrate stages in a method of forming a semiconductor device according to the second embodiment of the present invention. Referring to FIGS. 1, 3A, and 3B, the semiconductor substrate 110 may include the first region A having a cell region and the second region B having a peripheral circuit region. A device isolation layer 112 may be disposed in the semiconductor substrate to define an active region. The gate insulation layer 120 may be formed on the active region.

Figure 4A:
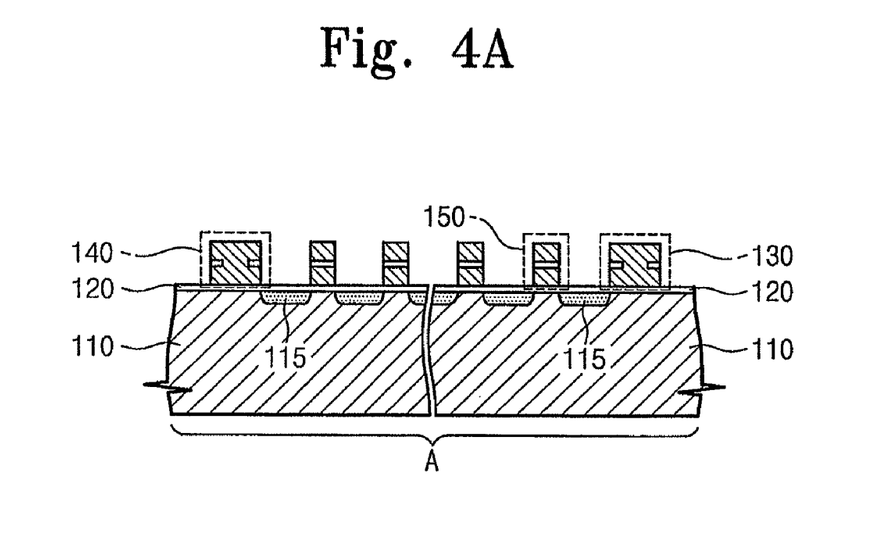
Figure 4B:
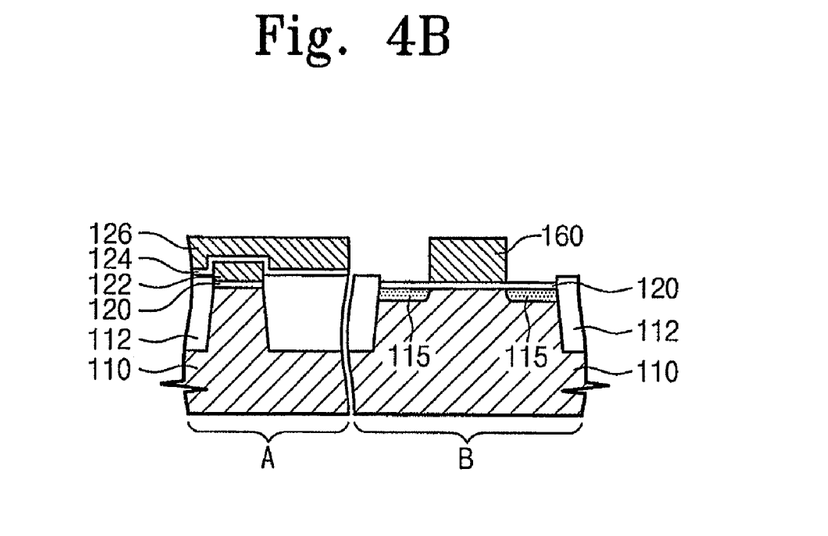

Referring to FIGS. 1, 4A, and 4B, the first string select line 130 and the first ground select line 140 may be formed on the active region of the first region A. First word lines 150 may be interposed between the first string select line 130 and the first ground select line 140. Impurity regions 115 may be formed in the semiconductor substrate 110 at opposite sides of the first word line 150, as well as sides of the first string select line 130 and the first ground select line 140. The peripheral circuit gate electrode 160 may be formed on the active region in the second region B, and impurity regions 115 may be formed in the semiconductor substrate 110 at opposite sides of the peripheral circuit gate electrode 160.

Forming the first string select line 130, the first ground select line 140, the first word line 150, and the peripheral gate electrode 160 may include forming and patterning the conductive layer 122, the insulation layer 124, and the conductive layer 126 on the semiconductor substrate 110. Before forming the conductive layer 126, a portion or all of the insulation layer 124 in a place corresponding to the first string select line 130, the first ground select line 140, and the peripheral circuit gate electrode 160 may be removed.

Figure 5A:
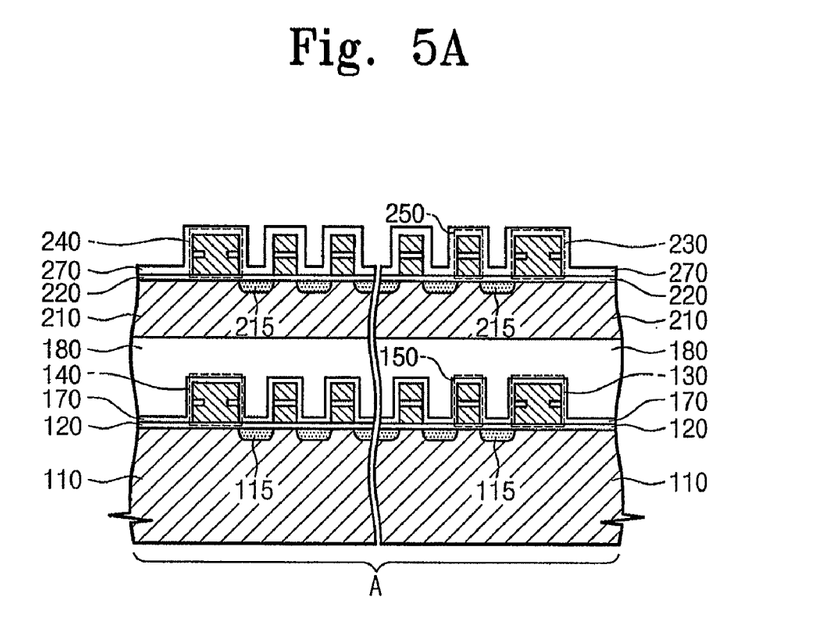
Figure 5B:
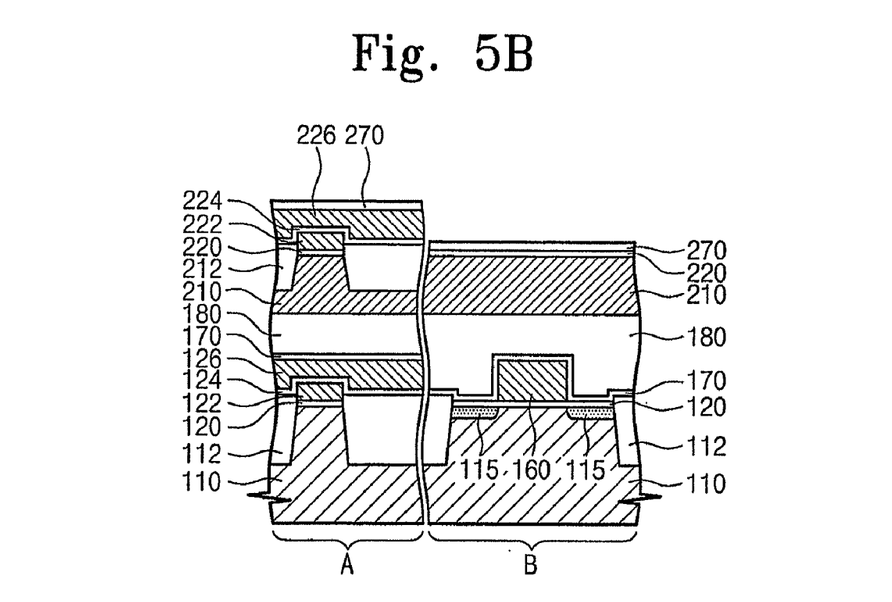

Referring to FIGS. 1, 5A, and 5B, the first protective layer 170 may be formed to cover the first string select line 130, the first ground select line 140, the first word line 150, and the peripheral gate electrode 160. The first protective layer 170 may be formed to a uniform thickness according to a structure profile thereunder, i.e., it may be a conformal layer.

In an implementation (not shown), sidewall spacers further may be formed before the protective layer 170, the sidewall spacers covering sidewalls of the first string select line 130, the first ground select line 140, the first word line 150, and the peripheral circuit gate electrode 160.

The first insulation layer 180 may be formed on the first protective layer 170, and the semiconductor layer 210 may be formed on the first insulation layer 180. The semiconductor layer 210 may be formed by, e.g., performing an epitaxial growth process on the semiconductor substrate 110, forming an amorphous silicon layer on the first insulation layer 180 and subsequently crystallizing the amorphous silicon layer, bonding a silicon wafer on the first insulation layer 180 and then removing an appropriate thickness of the silicon wafer, etc.

The device isolation layer 212 may be formed to define an active region in the semiconductor layer 210, and the gate insulation layer 220 may be formed on the active region. The second string select line 230 and the second ground select line 240 may be formed on the active region of the semiconductor layer 210 in the first region A. Second word lines 250 may be formed between the second string select line 230 and the second ground select line 240. Impurity regions 215 may be formed in the semiconductor layer 210 at opposite sides of the second word lines 250, as well as between the second word lines 250 and respective facing sides of the second string select line 230 and the second ground select line 240.

Forming the second string select line 230, the second ground select line 240, and the second word line 250 may include forming and patterning the conductive layer 222, the insulation layer 224, and the conductive layer 226 on the semiconductor layer 210. Before forming the conductive layer 226, a portion of the insulation layer 224 corresponding to the second string select line 230 and the second ground select line 240 may be removed.

The second protective layer 270 may be formed to cover the second string select line 230, the second ground select line 240, and the second word line 250. The second protective layer 270 may be formed to a thickness that is greater than that of the first protective layer 170. The second protective layer 270 may be formed with a uniform thickness according to a structure profile below the second protective layer 270, i.e., it may be conformal.

In an implementation (not shown), sidewall spacers may be formed before forming the second protective layer, the side wall spacers covering sidewalls of the second string select line 230, the second ground select line 240, and the second word lines 250.

Figure 6A:
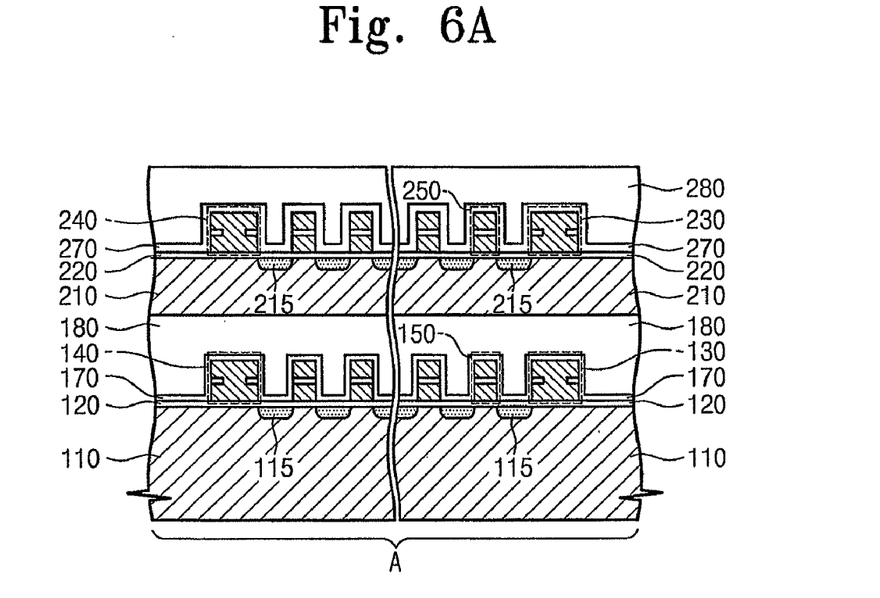
Figure 6B:
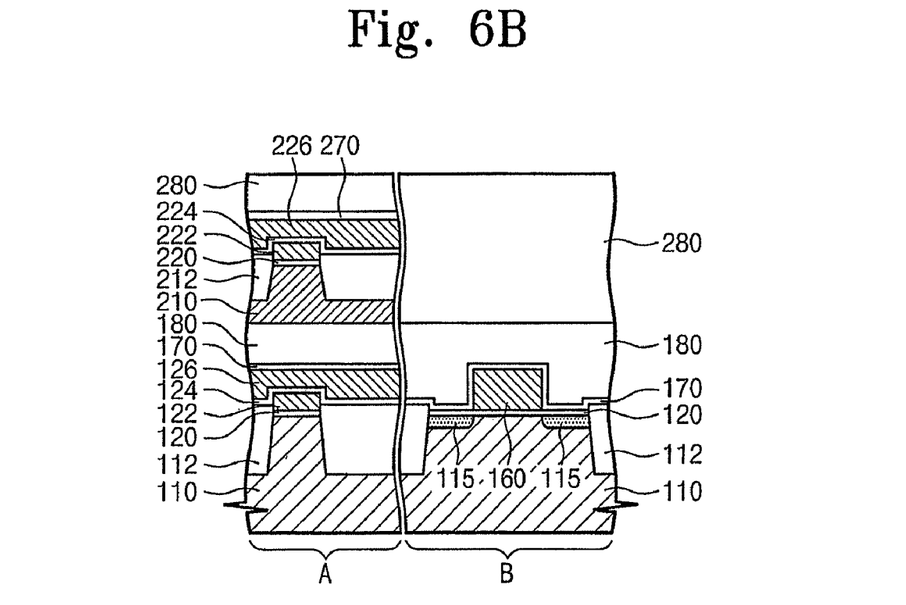

Referring to FIGS. 1, 6A, and 6B, and comparing FIGS. 5B and 6B, the semiconductor layer 210, the gate insulation layer 220, and the second protective layer 270 in the second region B may be removed, such that the first insulation layer 180 is exposed therein. The semiconductor pattern 210 and related features may remain in the first region A.

The second insulation layer 280 may be formed on the second protective layer 270 in the first region A and on the first insulation layer 180 in the second region B. The top surface of the second insulation layer 280 may be even across the first and second regions A and B, and may be formed using, e.g., deposition followed by a planarization process.

Figure 7A:
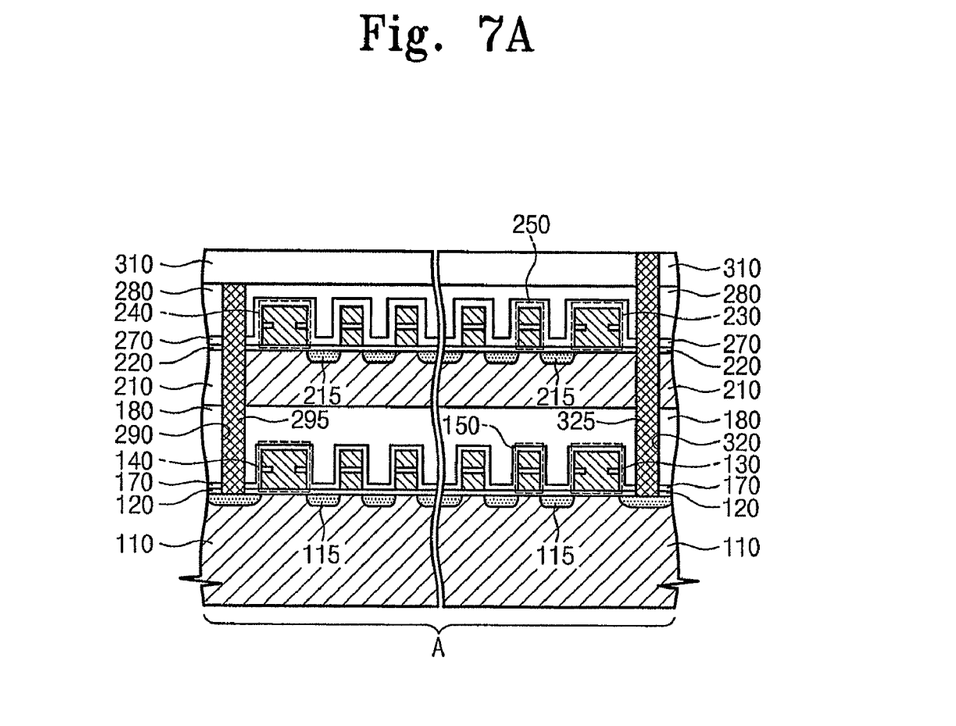
Figure 7B:
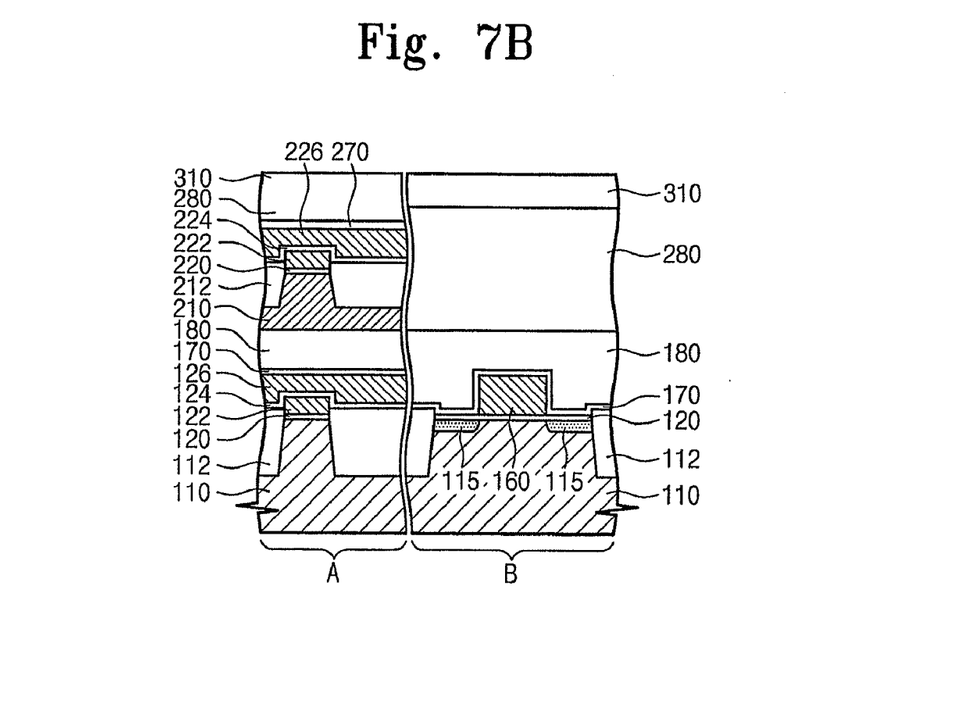

Referring to FIGS. 1, 7A, and 7B, the opening 290 may be formed, the opening 290 exposing the semiconductor substrate 110 at one side of the first and second ground select lines 140 and 240. The opening 290 may be formed by, e.g., patterning the second insulation layer 280, the second protective layer 270, the semiconductor pattern 210, the first insulation layer 180, and the first protective layer 170. The opening 290 may be shaped as a groove that extends in the same direction as the first and second ground select lines 140 and 240. The impurity region 115 may be formed in the substrate 110 by implanting impurity ions through the opening 290. The linear common source line 295 may be formed in the groove-shaped opening 290, e.g., by filling the opening 290 with a conductive material and then performing a planarization process on the conductive material so as to expose the top of the second insulation layer 280. The common source line 295 may be formed of, e.g., a doped polysilicon. The third insulation layer 310 may be formed on the second insulation layer 280.

A contact hole 320 may be formed to expose the semiconductor substrate 110 along a side of the first and second string select lines 130 and 230, e.g., by patterning the third insulation layer 310, the second insulation layer 280, the second protective layer 270, the semiconductor pattern 210, the first insulation layer 180, and the first protective layer 170. The impurity region 115 may be formed in the substrate 110 by implanting impurity ions through the contact hole 320T. The bit line contact plug 325 may be formed in the contact hole 320, e.g., by filling the contact hole 320 with a conductive material and performing a planarization process to expose the top of the third insulation layer 310. The bit line contact plug 325 may be, e.g., a stacked structure of doped polysilicon and tungsten.

In an implementation (not shown), impurity ions in the bit line contact plug 325 and/or the common source line 295 may be diffused by performing a thermal treatment process, in order to form impurity regions at one sides of the second string select line 230 and the second ground select line 240.

Figure 8A:
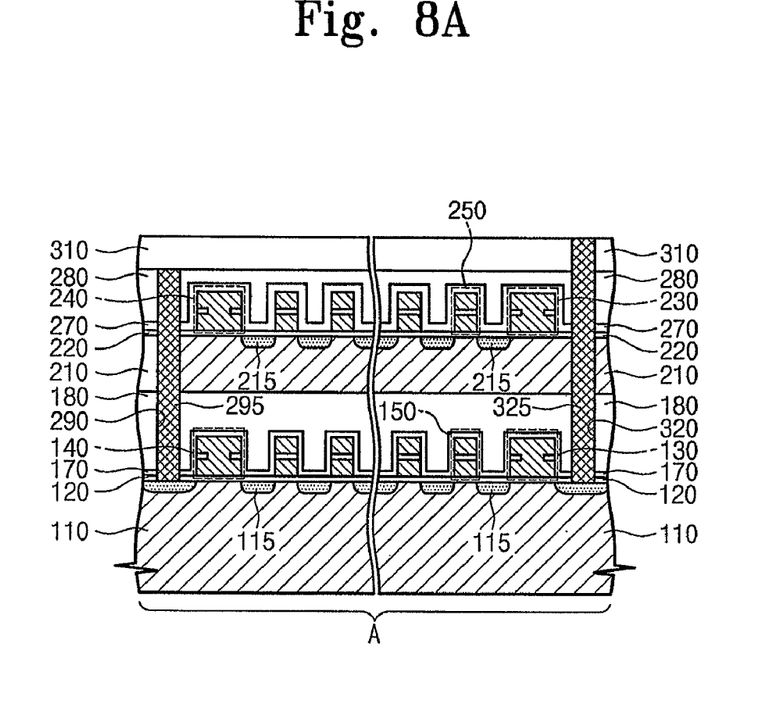
Figure 8B:
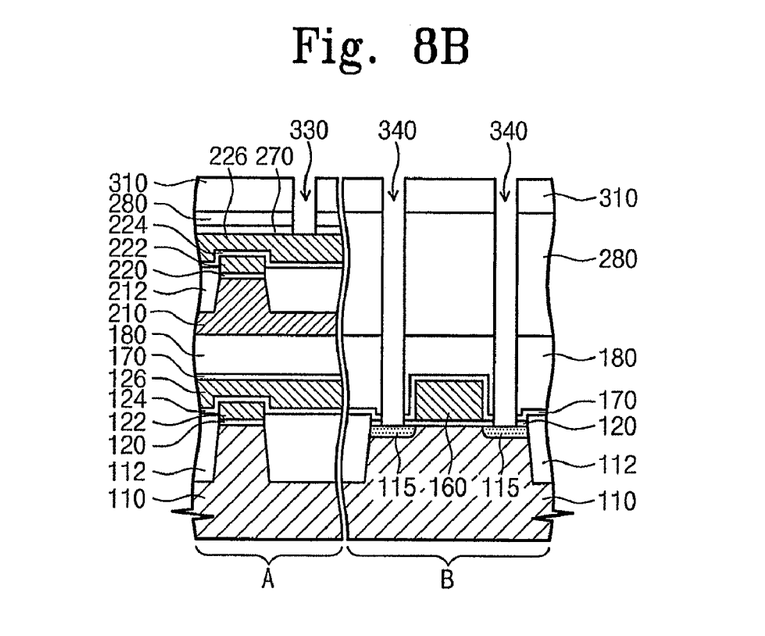

Referring to FIG. 8B, a first contact hole 330 may be formed in the first region A and a second contact hole 340 may be formed in a second region B, e.g., using an etching process. The first and second protective layers 170 and 270 may serve as etch stop layers during the etching process. The first and second contact holes 330 and 340 may be simultaneously formed through a same etching process.

The first contact hole 330 may penetrate the third insulation layer 310, the second insulation layer 280, and the second protective layer 270 to expose the second word line 250. The second contact hole 340 may penetrate the third insulation layer 310, the second insulation layer 280, the first insulation layer 180, and the first protective layer 170 to expose an impurity region 115 of the peripheral circuit transistor.

The first and second protective layers 170 and 270 may have an etch selectivity with respect to the first, second and third insulation layers 180, 280, and 310. For example, the first and second protective layers 170 and 270 may be formed of a silicon nitride layer, and the first, second, and third insulation layers 180, 280, and 310 may be formed of a silicon oxide layer.

As described above, the second protective layer 270 may be thicker than the first protective layer 170. Accordingly, the first contact hole 330 and the second contact hole 340 may be simultaneously formed by the same etching process, even though the depths of the first contact hole 330 and the second first contact hole 340 are different from one another.

In detail, during the etching of the third insulation layer 310, the formation of both contact holes 330 and 340 may proceed at a comparable rate. Further, during the etching of the second insulation layer 280, the formation of both contact holes 330 and 340 may continue at a comparable rate, but since the thickness of second insulation layer 280 in the area of the first contact hole 330 may be significantly less than that in the area of the second contact hole 340, it will be appreciated that the etching process of the first contact hole 330 will penetrate the corresponding area of the second insulation layer 280 before the etching process of the second contact hole 340 penetrates second insulation layer 280 in that area. Moreover, the etching process may be continued for some period of time after the first contact hole 330 is completed, so as to penetrate the first insulation layer 180 for the second contact hole 340. Accordingly, the thickness of the second protective layer 270 at the bottom of the first contact hole 330 may be greater than the thickness of the first protective layer at the bottom of the second contact hole 340, in order to withstand the etching process without premature breakthrough.

Additionally, the initial thickness of the second protective layer 270 may be determined such that the final etching of the second protective layer 270 and the first protective layer 170 is completed at substantially the same time. That is, the thickness of the second protective layer 270 that remains when the etching of the second contact hole 340 penetrates the first insulation layer 180 may be substantially the same as the thickness of the first protective layer 170.

The thickness of the second protective layer 270, i.e., the thickness of the second protective layer 270 relative to that of the first protective layer 170, may be determined in accordance with the thicknesses of the first and second insulation layers 180 and 280, and in accordance with the etch selectivity between the second protective layer 270 and the first and second insulation layers 180 and 280. Accordingly, contact holes having respectively different heights may be simultaneously formed, while reducing or eliminating damage to a thin layer at the bottom of the contact holes.

Figure 9A:
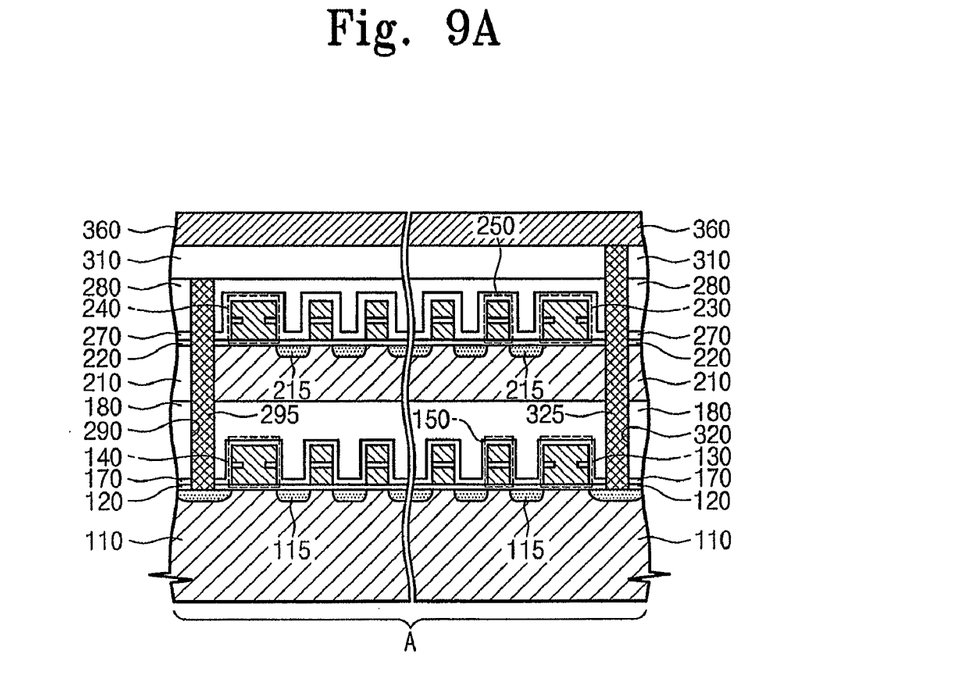
Figure 9B:
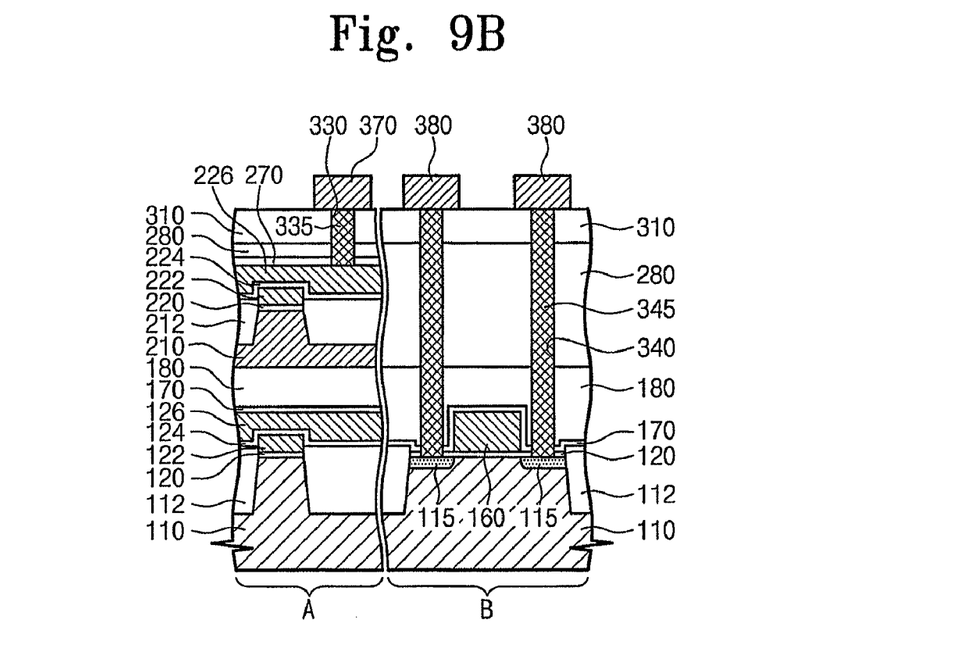

Referring to FIGS. 1, 9A, and 9B, the first contact plug 335 may be formed in the first contact hole 330 and the second contact plug 345 may be formed in the second contact hole 340. The first contact plug 335 and the second contact plug 345 may be formed simultaneously, e.g., by filling the first and second contact holes 330 and 340 with a conductive material and performing a planarization process to expose the top surface of the third insulation layer 310. The first and second contact plugs 335 and 345 may be formed of, e.g., tungsten.

The bit line 360, the first metal pattern 370, and the second metal pattern 380 may be formed, e.g., by forming and patterning a metal layer on the third insulation layer 310. The bit line 360 may be electrically connected to the string select transistor through a bit line contact plug 325. The first metal pattern 370 may be electrically connected to a second word line 250 through the first contact plug 335, and the second metal pattern 380 may be electrically connected to the peripheral circuit transistor through the second contact plug 345.

As described above, the contact plugs 335 and 345 may have respectively different heights, due to the differing depths of the contact holes 330 and 340, may be simultaneously formed, and may be formed even while reducing or eliminating damage to a thin layer at the bottom thereof. Accordingly, the reliability and the operational characteristics of a highly-integrated semiconductor device such as a memory device having multi-structure transistors may be improved, and the method of forming the device may be simplified.

FIGS. 10A through 11A correspond to FIG. 2A and illustrate stages in a method of forming a semiconductor device according to a third embodiment of the present invention, and FIGS. 10B through 11B correspond to FIG. 2B and illustrate stages in a method of forming a semiconductor device according to the third embodiment of the present invention. In this embodiment, an exemplary method for forming a contact plug connected to a word line will be described. For clarity, features and/or processes that may be substantially the same as those described above will not be repeated.

Figure 10A:
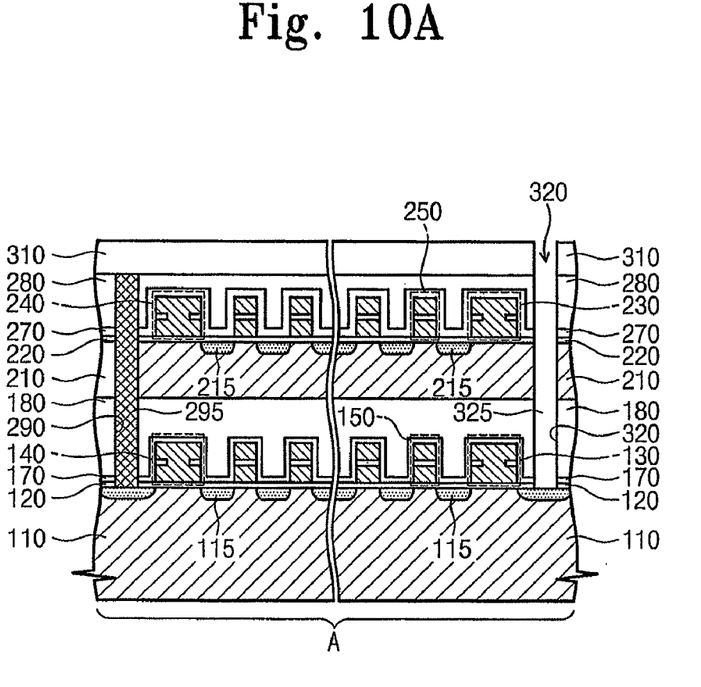
Figure 10B:
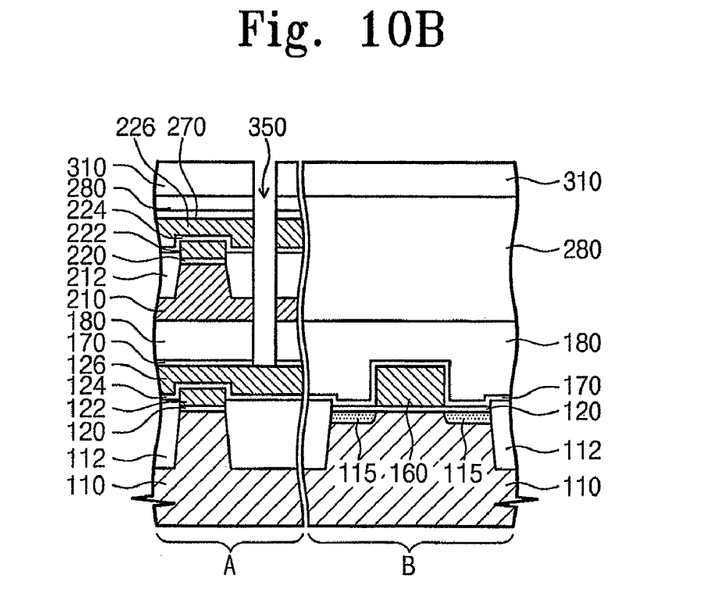

Referring to FIGS. 1, 10A, and 10B, the third contact hole 320 and the fourth contact hole 350 may be formed in the first region A. The third contact hole 320 and the fourth contact hole 350 may be simultaneously formed by a same etching process.

The third contact hole 320 may penetrate the third insulation layer 310, the second insulation layer 280, the second protective layer 270, the semiconductor pattern 210, the first insulation layer 180, and the first protective layer 170 to expose the semiconductor substrate 110. The fourth contact hole 350 may penetrate the third insulation layer 310, the second insulation layer 280, the second protective layer 270, the device isolation layer 212, the semiconductor pattern 210, the first insulation layer 180, and the first protective layer 170 to expose the semiconductor substrate 110.

The top layers may be etched using the second protective layer 270 as an etch stop layer, thereby normalizing the formation of the upper portions of the third and fourth contact holes 320 and 350. Subsequently, the lower layers may be etched using the first protective layer 170 as an etch stop layer after which the first protective layer 170 may be etched, thereby enabling the simultaneous formation of the third and fourth contact holes 320 and 350 having different depths, while reducing or eliminating damage due to over-etch.

Figure 11A:
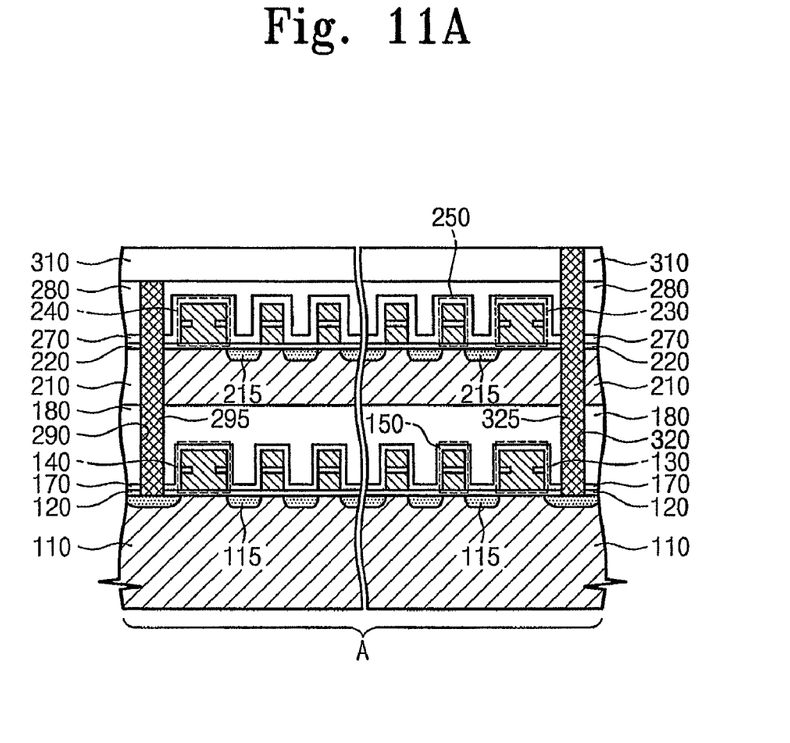
Figure 11B:
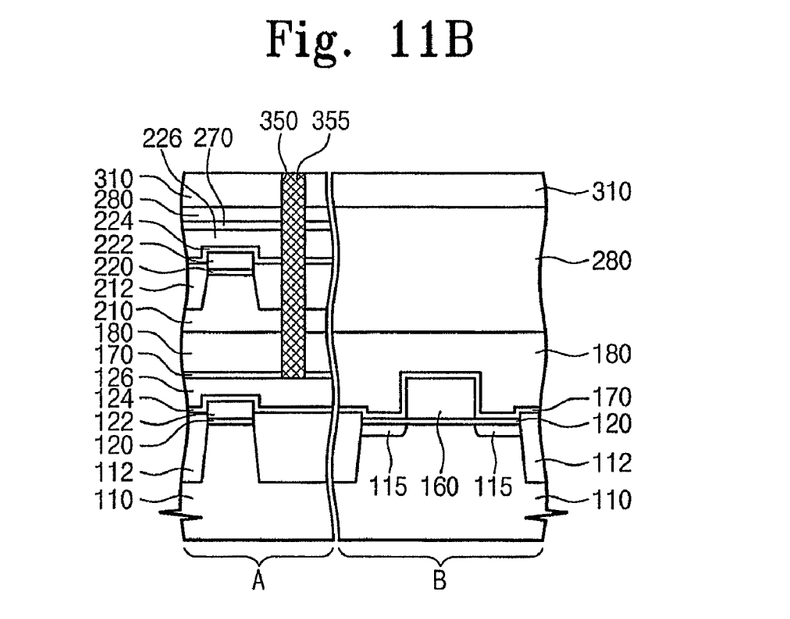

Referring to FIGS. 1, 11A, and 11B, the third contact plug 325 may be formed in the third contact hole 320, and a fourth contact plug 355 may be formed in the fourth contact hole 350. The third and fourth contact plugs 325 and 355 may be simultaneously formed, e.g., by filling the third and fourth contact holes 320 and 350 with a conductive material and performing a planarization process to expose the top of the third insulation layer 310. The third and fourth contact plugs 325 and 355 may be formed of, e.g., tungsten.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor device, comprising:
   providing a semiconductor substrate including a first region and a second region;
   forming first transistors on the semiconductor substrate in the first region;
   forming a first protective layer that covers the first transistors;
   forming a first insulation layer on the first protective layer;
   forming a semiconductor layer on the first insulation layer;
   forming second transistors on the semiconductor layer in the first region;
   forming a second protective layer covering the second transistors in the first region;
   removing the second protective layer in the second region; and
   forming a second insulation layer on the second protective layer in the first region and on the first insulation layer in the second region.

2. The method as claimed in claim 1, wherein the first transistors include cell transistors in the first region and peripheral circuit transistors in the second region, the method further comprising:
   forming a first contact plug that penetrates the second insulation layer and the second protective layer to contact a second transistor; and
   forming a second contact plug that penetrates the second insulation layer, the second protective layer, the first insulation layer and the first protective layer to contact a peripheral circuit transistor.

3. The method as claimed in claim 1, wherein the first and second protective layers have an etch selectivity with respect to the first and the second insulation layers.

4. The method as claimed in claim 1, wherein the second protective layer is formed to have a thickness greater than that of the first protective layer.

5. The method as claimed in claim 1, wherein each of the second transistors is formed to include a word line.

6. The method as claimed in claim 1, further comprising:
   removing the second protective layer and the semiconductor layer in the second region at the same time.

7. A method of forming a semiconductor device, comprising:
   providing a semiconductor substrate including a first region and a second region;

forming first word lines on the semiconductor substrate in the first region, the first word lines being disposed between a first string select line and a first ground select line;

forming a peripheral circuit transistor in the second region;

forming a first protective layer that covers the first string select line, the first ground select line, the first word lines, and the peripheral circuit transistor;

forming a first insulation layer on the first protective layer;

forming a semiconductor layer on the first insulation layer;

forming second word lines on the semiconductor layer in the first region;

forming a second protective layer that covers the second word lines in the first region;

removing the second protective layer in the second region;

forming a second insulation layer on the second protective layer in the first region and on the first insulation layer in the second region;

forming a first contact hole that exposes the second word line; and forming a second contact hole that exposes the peripheral circuit transistor, wherein the first contact hole and the second contact hole are formed at a same time.

8. The method as claimed in claim 7, further comprising:

forming a first contact plug in the first contact hole, the first contact plug penetrating the second insulation layer and the second protective layer to contact the second word line; and forming a second contact plug in the second contact hole, the second contact plug penetrating the second insulation layer, the second protective layer, the first insulation layer, and the first protective layer to contact the peripheral circuit transistor.

9. The method as claimed in claim 7, wherein the first protective layer and the second protective layer are formed of a same material.

10. The method as claimed in claim 7, further comprising:

forming a third contact plug that penetrates the second insulation layer, the second protective layer, the semiconductor pattern, the first insulation layer, and the first protective layer, the third contact plug contacting the semiconductor substrate at one side of the first string select line; and forming a fourth contact plug that penetrates the second insulation layer, the second protective layer, the semiconductor pattern, the first insulation layer, and the first protective layer, the fourth contact plug contacting a first word line.

11. The method as claimed in claim 10, wherein:

forming the third contact plug includes etching the second insulation layer, the second protective layer, the semiconductor pattern, the first insulation layer, and the first protective layer to form a third contact hole that exposes the semiconductor substrate at one side of the first string select line, forming the fourth contact plug includes etching the second insulation layer, the second protective layer, the semiconductor pattern, the first insulation layer, and the first protective layer to form a fourth contact hole that exposes the first word line, and the third contact hole and the fourth contact hole are formed by the same etching process.

12. The method as claimed in claim 11, wherein the third contact plug and the fourth contact plug are formed of the same material.

13. The method as claimed in claim 7, wherein the second protective layer is formed to have a thickness greater than that of the first protective layer.

14. The method as claimed in claim 7, further comprising: removing the second protective layer and the semiconductor layer in the second region at the same time.

* * * * *